(12) United States Patent
Kan

(10) Patent No.: US 7,092,422 B2
(45) Date of Patent: Aug. 15, 2006

(54) SELF-PULSATION TYPE SEMICONDUCTOR LASER

(75) Inventor: Yasuo Kan, Mihara (JP)

(73) Assignee: Sharp Kabushiki Kaisha, Osaka (JP)

(*) Notice: Subject to any disclaimer, the term of this patent is extended or adjusted under 35 U.S.C. 154(b) by 191 days.

(21) Appl. No.: 10/713,657

(22) Filed: Nov. 14, 2003

(65) Prior Publication Data

US 2004/0101011 A1 May 27, 2004

(30) Foreign Application Priority Data

Nov. 14, 2002 (JP) .............................. 2002-330708

(51) Int. Cl.
*H01S 5/00* (2006.01)

(52) U.S. Cl. .................. 372/45.01; 372/43.01
(58) Field of Classification Search .................. 372/45, 372/45.01

See application file for complete search history.

(56) References Cited

U.S. PATENT DOCUMENTS 5,949,809 A * 9/1999 Ashida .................... 372/46.01
6,002,701 A * 12/1999 Kan et al. ................ 372/46.01
6,865,202 B1 * 3/2005 Matsumoto ............... 372/45.01
2004/0159849 A1 * 8/2004 Yamaguchi et al. ........... 257/94

FOREIGN PATENT DOCUMENTS

| JP | 06-069589 A | 3/1994 |
|----|-------------|--------|
| JP | 07-193316 | 7/1995 |
| JP | 08-316563 | 11/1996 |
| JP | 09-181389 | 7/1997 |
| JP | 2000357842 A * | 12/2000 |

OTHER PUBLICATIONS

Chinese Office Action issued Jun. 10, 2005, for Chinese Patent Application No. 200310116121.4 filed Nov. 14, 2003, 7 pages.

* cited by examiner

*Primary Examiner*—Armando Rodriguez
*Assistant Examiner*—Dung Nguyen
(74) *Attorney, Agent, or Firm*—Morrison & Foerster LLP

(57) ABSTRACT

In a self-pulsation type semiconductor laser, a first clad layer of a first conductivity type, an active layer, and a second clad layer of a second conductivity type having a striped ridge portion are successively stacked on a semiconductor substrate of the first conductivity type. In an embedding layer formed on either side surface of the ridge portion and on either flat portion other than the ridge portion of the second clad layer, a saturable absorption layer is provided on a material layer having a refractive index equal to or greater than that of the second clad layer and not absorbing laser light.

17 Claims, 11 Drawing Sheets

SELF-PULSATION TYPE SEMICONDUCTOR LASER

BACKGROUND OF THE INVENTION

1. Field of the Invention

The present invention relates to semiconductor lasers, and more particularly to a low-noise, self-pulsation type semiconductor laser suitable as a light source for recording and reproducing information on an optical disk or the like.

2. Description of the Background Art

In the case that a semiconductor laser for lasing in a uniaxial mode receives laser light feedback reflected from an optical disk surface, the lasing state of the semiconductor laser changes unstably due to the interference with the optical feedback, thereby causing noise. Such noise is called optical feedback noise, which becomes a major obstacle to using the semiconductor laser as a light source of an optical pick-up for reproducing information on an optical disk or the like.

Conventionally, in order to reduce the optical feedback noise, a high frequency voltage has been superposed on a driving voltage of the semiconductor laser to lower the coherence of the laser light. However, this method requires an external circuit for the superposition of e high frequency voltage, so that costs and sizes of optical pick-up parts are increased and further the circuit is liable to emit undesirable electromagnetic waves.

In a self-pulsation type semiconductor laser provided with a saturable absorption region in an optical waveguide, on the other hand, the saturable absorption region functions to cause self-pulsation of the lasing intensity within a frequency range from some hundred megahertz to some gigahertz, so that the coherence of the laser light can be lowered. Further, the superposition of high frequency voltage is unnecessary in the self-pulsation type semiconductor laser and thus an external circuit therefor can be eliminated. As such, it becomes possible to produce compact pick-up parts not emitting electromagnetic waves.

FIG. 11 shows a self-pulsation type semiconductor laser of a first conventional example in a schematic cross section. Here, an AlGaInP-based semiconductor laser is shown as an example of the self-pulsation type semiconductor laser for emitting light of red color.

The semiconductor laser of FIG. 11 is provided with an n type GaAs substrate 1 and a semiconductor stacked-layered structure epitaxially grown thereon. Specifically, the semiconductor stacked-layered structure has an n type AlGaInP first clad layer 2, a GaInP active layer 3 and a p type AlGaInP second clad layer 4 which are successively stacked on the substrate. Second clad layer 4 has a striped ridge portion, with both sides of the ridge portion (i.e., non-ridge portions) being thinner than the ridge portion. A p type GaInP intermediate layer 5 and a p type GaAs contact layer 6 are formed on the ridge portion of second clad layer 4. An n type GaAs embedding layer 9 is formed on either side of the striped ridge portion. Light confinement in a horizontal direction is achieved by an effective refractive index difference $\Delta n$ generated between the ridge portion and the non-ridge portion. A p-side electrode 10 is provided on the upper surface of the semiconductor stacked-layered structure, and an n-side electrode 11 is provided on the backside of substrate 1.

In the self-pulsation type semiconductor laser of the first conventional example, the light confinement in the horizontal direction parallel to active layer 3 is weaken by designing effective refractive index difference $\Delta n$ to be small, so that the light intensity within the active layer is increased in the side regions corresponding to both sides of the stripe. The side regions can serve as the saturable absorption regions to realize the self-pulsation.

In the structure of the first conventional example, which is commonly used in a self-pulsation type semiconductor laser, the regions of the active layer corresponding to the both sides of the stripe are used as the saturable absorption regions. Thus, it is necessary to increase the light intensity in the regions, and the light confinement in a direction perpendicular to the active layer also needs to be set high. As a result, the divergent angle of the emitted light increases in the direction perpendicular to the active layer and thus the ellipticity of the beam cross section also increases. Further, the light intensity at the end face of the active layer increases, thereby lowering the COD (catastrophic optical damage) level.

To solve the foregoing problems, the present inventors have provided a self-pulsation type semiconductor laser in which it is unnecessary to increase the light confinement in the stacked-layered direction perpendicular to the active layer and then the ellipticity of the beam cross section is small, by incorporating a saturable absorption region in the embedding layer of the first conventional example (see Japanese Patent Laying-Open No. 9-181389). This self-pulsation type semiconductor laser is shown as a second conventional example in FIG. 12 in a schematic cross section.

The semiconductor laser shown in FIG. 12 is provided with an n type GaAs substrate 1, and a semiconductor stacked-layered structure grown thereon. The semiconductor stacked-layered structure includes an n type $(Al_{0.65}Ga_{0.35})$ InP first clad layer 2, a GaInP active layer 3 and a p type $(Al_{0.65}Ga_{0.35})$ InP second clad layer 4, which are stacked successively on the substrate. Second clad layer 4 has a striped ridge portion 4a, and regions (non-ridge portions) 4b on both sides of the ridge portion are thinner than the ridge portion. A p type GaInP intermediate layer 5 and a p type GaAs contact layer 6 are formed on the ridge portion of second clad layer 4. An n type $Al_{0.6}Ga_{0.4}As$ layer 8d, an n type GaAs saturable absorption region 7, an n type $Al_{0.6}Ga_{0.4}As$ layer 8d, and an n type GaAs embedding layer 9 are formed on either side of the striped ridge portion. A p-side electrode 10 is provided on the upper surface of the semiconductor stacked-layered structure, and an n-side electrode 11 is provided on the backside of substrate 1.

In the semiconductor laser of the second conventional example, carriers generated by absorption of laser light are accumulated in the saturable absorption region formed in the embedding layer thereby causing saturation of light absorption, so that the self-pulsation is achieved similarly as in the first conventional example. In the first conventional example, the active layer regions on both sides of the ridge can serve as the saturable absorption layers. However, electric current spreads in a lateral direction from the ridge, so that the carriers are introduced also into the active layer regions on both sides of the ridge. Thus, the change in absorbable light amount attributable to carriers generated by absorption of laser light is small. In the second conventional example, on the other hand, the saturable absorption layer is formed in the embedding layer where the current does not flow. Thus, the carriers do not exist in the saturable absorption layer during the state in absence of lasing. Accordingly, the absorbable light amount greatly changes depending on carriers generated by absorption of laser light. Further, in the second conventional example, since the excited carriers are generated in regions far away from the restart planes of crystal growth after formation of the ridge, trapping of the carriers is unlikely to occur at non-radiative centers in the vicinity of the restart planes of crystal growth, and thus the saturable absorption layer can function effectively.

In the second conventional example, although the light intensity in the saturable absorption region needs to be increased to cause self-pulsation, it is unnecessary to thicken the active layer for that purpose. Thus, it is possible to provide a self-pulsation type semiconductor laser having a small ellipticity of the beam cross section.

However, with the above-described self-pulsation type semiconductor laser having the saturable absorption region formed in the embedding layer, the self-pulsation stops at a high temperature of more than 70° C. or with an optical output of more than 6 mW.

SUMMARY OF THE INVENTION

In view of the foregoing, an object of the present invention is to provide a self-pulsation type semiconductor laser that can operate at a high temperature with a high output.

A self-pulsation type semiconductor laser according to the present invention includes a first clad layer of a first conductivity type, an active layer, and a second clad layer of a second conductivity type having a striped ridge portion, which are successively stacked on a semiconductor substrate of the first conductivity type. In an embedding layer formed on either side surface of the ridge portion and on either flat portion other than the ridge portion of the second clad layer, a saturable absorption layer is provided on a material layer having a refractive index equal to or greater than that of the second clad layer and not absorbing laser light.

In other words, in order to increase light intensity in the saturable absorption layer within the embedding layer, a layer having the refractive index equal to or greater than that of the clad layer in the ridge is provided as a lower or upper layer neighboring the saturable absorption layer, to make light easier to spread to the saturable absorption region.

In the self-pulsation type semiconductor laser of the present invention, distribution of the refractive index is preferably made asymmetrical in a stacking direction of the layers with respect to the active layer, to make the light more likely to spread toward the ridge.

According to the present invention as described above, the light intensity in the saturable absorption layer within the embedding layer can be increased as compared to the self-pulsation type semiconductor laser of the second conventional example. Thus, it is possible to provide a self-pulsation type semiconductor laser capable of operating at a higher temperature with a higher output.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1:
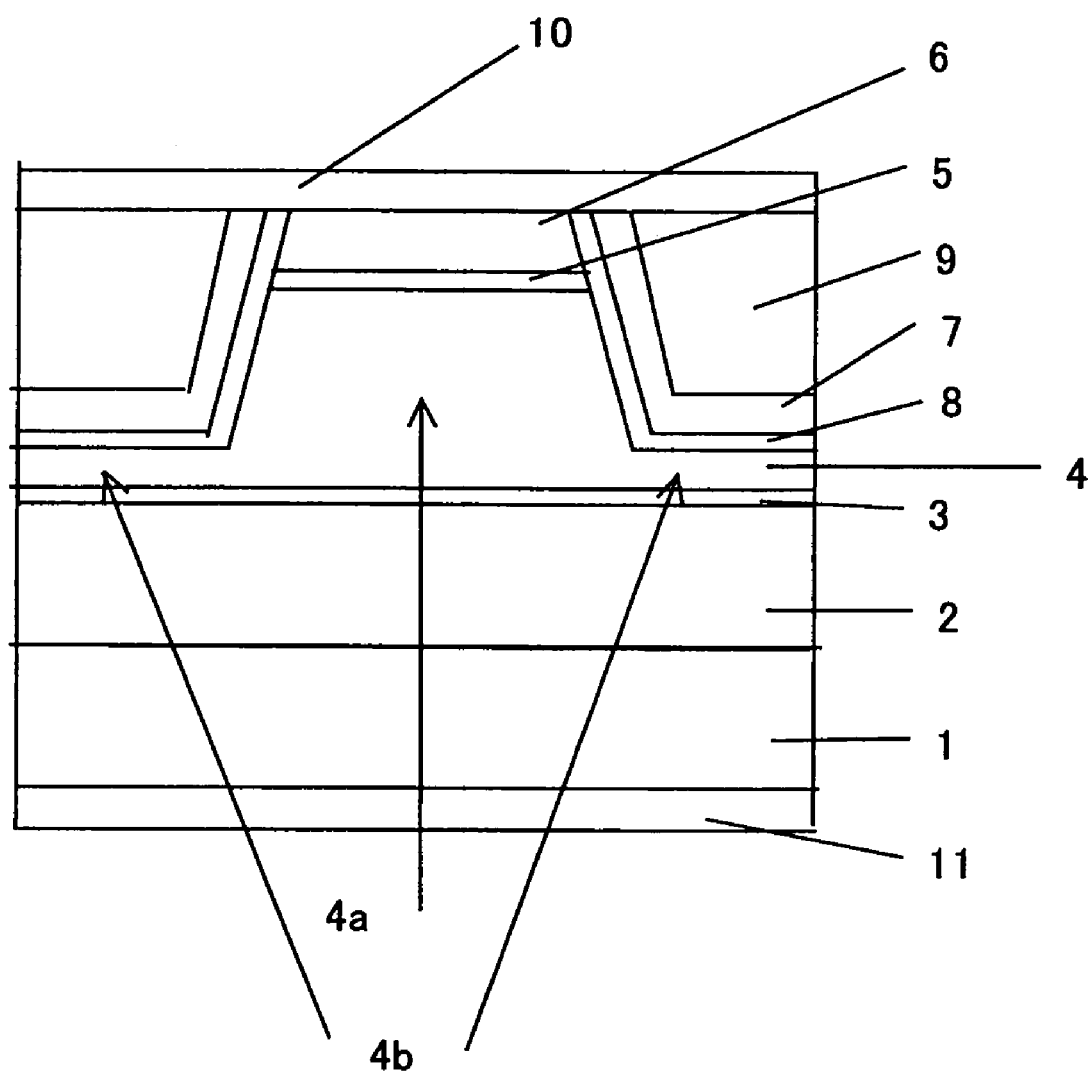
FIG. 1 is a schematic cross sectional view of a self-pulsation type semiconductor laser according to a first embodiment of the present invention.

FIG. 1 shows in a schematic cross section an ALGaInP-based semiconductor laser according to the first embodiment of the present invention. In this semiconductor laser, an n type $(Al_{0.65}Ga_{0.35})$ InP first clad layer 2, an SCH(Separation Confinement Heterostructure)-MQW (multi-quantum well) active layer 3 of undoped GaInP/AlGaInP, a p type $(Al_{0.65}Ga_{0.35})$ InP second clad layer 4, a p type GaInP intermediate layer 5, and a p type GaAs contact layer 6 are stacked successively on an n type GaAs substrate 1. SCH-MQW active layer 3 has a structure in which an MQW including GaInP quantum well layers (four layers, 5 nm thick each) and $(Al_{0.50}Ga_{0.50})$ InP barrier layers (three layers, 5 nm thick each) alternately stacked one on another is sandwiched between two $(Al_{0.50}Ga_{0.50})$ InP guide layers (50 nm thick each).

Second clad layer 4 has a striped ridge portion 4a, and flat portions 4b on both sides of the ridge portion are thinner than the ridge portion. An embedding layer including a saturable absorption layer 7 is formed on either side surface of ridge portion 4a and on either flat portion 4b of p type clad layer 4.

Saturable absorption layer 7 is formed of undoped GaInP, on an n type $(Al_{0.50}Ga_{0.50})$ InP layer 8 having a refractive index greater than that of second clad layer 4. A current blocking layer 9 of an n type GaAs layer is formed on saturable absorption layer 7. Provided on the embedding layer and on the p type contact layer is a p-side electrode 10 formed of Au/Mo/AuZn. An n-side electrode 11 of Au/Mo/Ni/AuGe is provided on the backside of substrate 1.

Figure 2A:
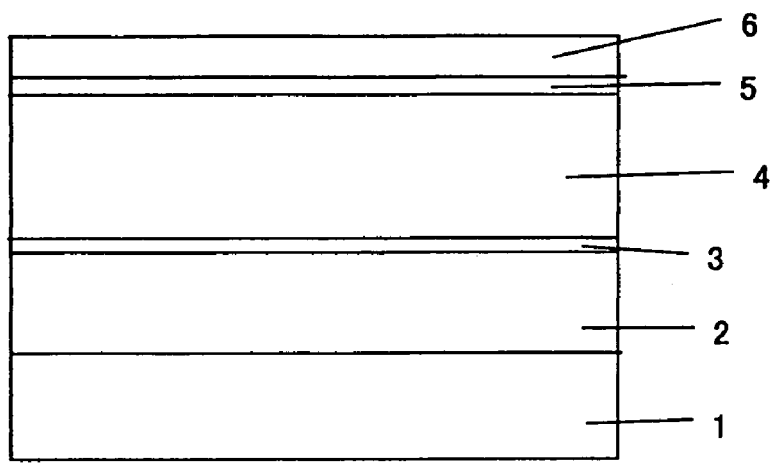
FIGS. 2A–2C are schematic cross sectional views illustrating a method for forming the self-pulsation type semiconductor laser of FIG. 1.
Figure 2B:
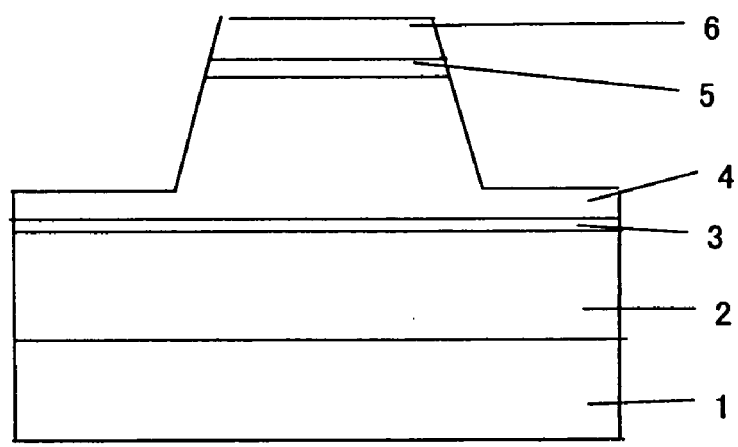
Figure 2C:
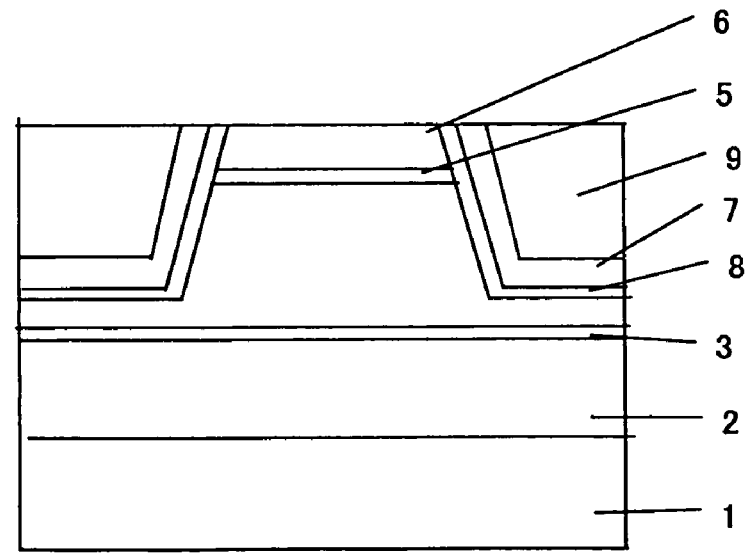

A method for forming the semiconductor laser of FIG. 1 is shown by way of example in FIGS. 2A–2C in schematic cross sections.

Firstly, as shown in FIG. 2A, molecular beam epitaxy (MBE) is employed to grow n type first clad layer 2, active layer 3, p type second clad layer 4, p type intermediate layer 5, and p type contact layer 6 on substrate 1.

Next, as shown in FIG. 2B, photolithography and etching are employed to selectively remove portions of p type contact layer 6, p type intermediate layer 5 and p type second clad layer 4 which do not constitute the striped ridge structure 4a.

Thereafter, as shown in FIG. 2C, MBE is employed again to successively grow (restart of crystal growth) n type AlGaInP layer 8, saturable absorption layer 7, and n type GaAs layer 9. Lastly, an unnecessary region grown on top of ridge portion 4a is removed by selective etching, and then the p-side and n-side electrodes are formed.

Saturable absorption layer 7 is formed of a semiconductor having such a bandgap that it absorbs laser light and generates excited carriers. On the other hand, AlGaInP layer 8 is formed of a semiconductor layer having a bandgap greater than that of saturable absorption layer 7 and not absorbing laser light. AlGaInP layer 8 is indispensable for preventing the excited carriers generated within saturable absorption layer 7 from recombining and being lost at the non-radiative recombination centers (interface traps) on the restart plane of crystal growth. In the first embodiment, AlGaInP layer 8 having a refractive index greater than that of second clad layer 4 also functions to spread the laser light toward saturable absorption layer 7. As a result, light intensity in saturable absorption layer 7 increases, which promotes self-pulsation of the semiconductor laser.

Figure 3:
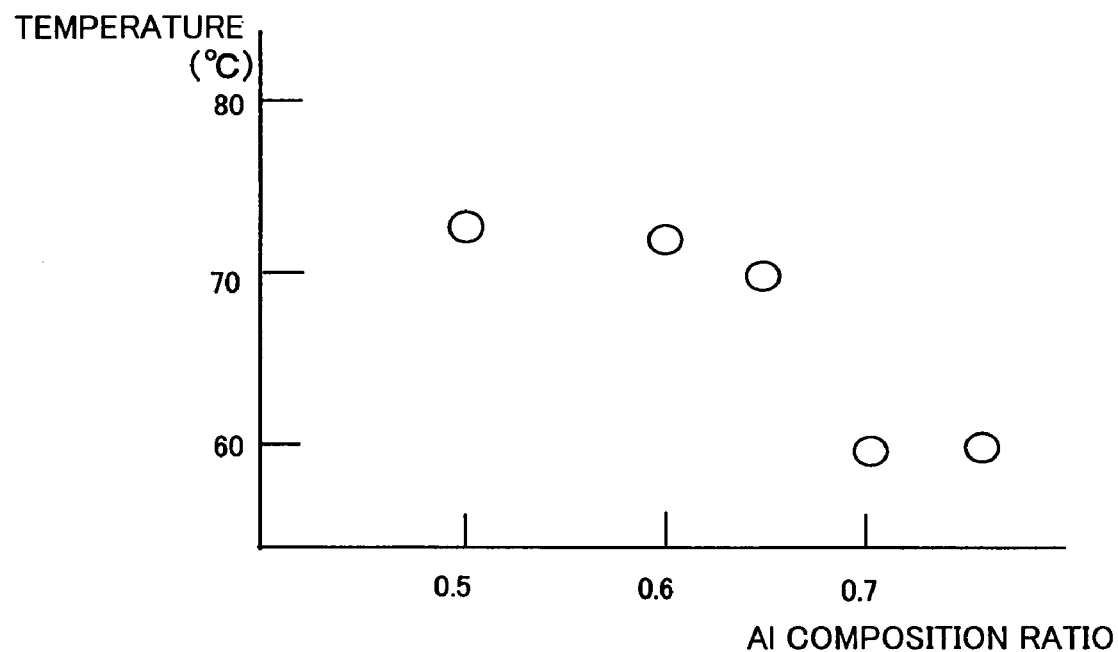
FIG. 3 is a graph showing the relation between the Al composition ratio of the AlGaInP layer and the maximum temperature where self-pulsation is achieved in the self-pulsation type semiconductor laser of FIG. 1.

The graph of FIG. 3 shows results of measurement of the maximum temperature at which self-pulsation is achieved with an optical output of 5 mW, with the Al composition ratio of AlGaInP layer 8 being changed, in the semiconductor laser of the first embodiment. The thickness of AlGaInP layer 8 was set to 0.1 nm. It is seen from the graph that the temperature at which the self-pulsation occurs is improved in the region where the refractive index of AlGaInP layer 8 is greater, i.e., in the region where the Al composition ratio is smaller than 0.65 which corresponds to the Al composition ratio of the second clad layer. In that composition region, the self-pulsation operation is achieved even at a temperature higher than 70° C.

Figure 4:
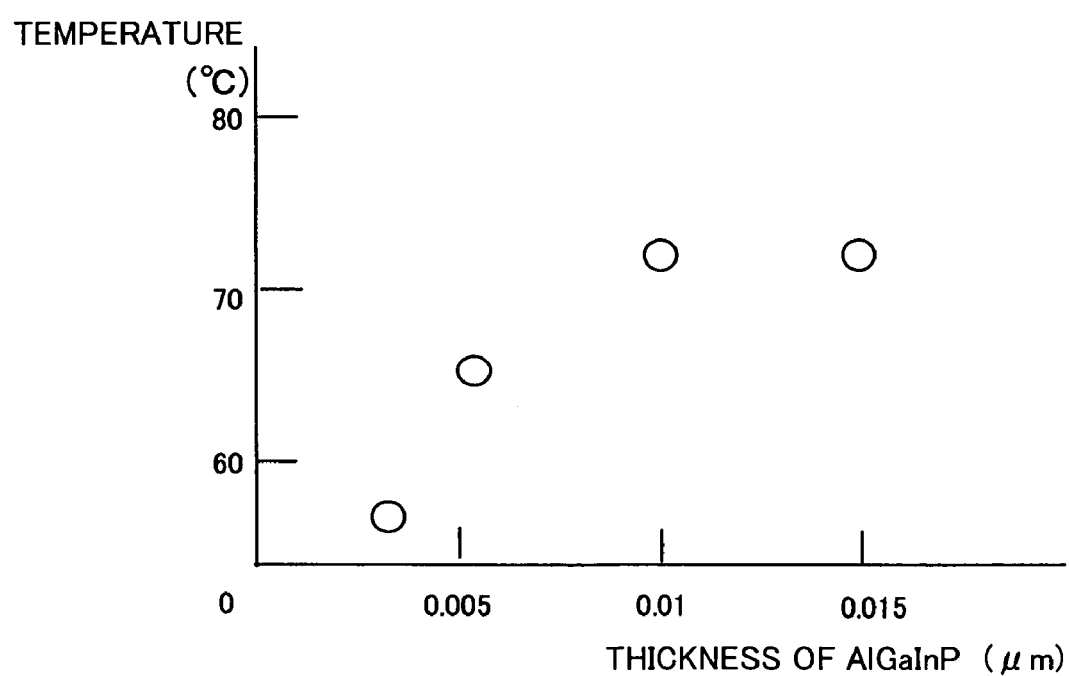
FIG. 4 is a graph showing the relation between the thickness of the AlGaInP layer and the maximum temperature where self-pulsation is achieved in the self-pulsation type semiconductor laser of FIG. 1.

The graph of FIG. 4 shows results of measurement of the maximum temperature at which self-pulsation is achieved with an optical output of 5 mW, with the thickness of AlGaInP layer 8 being changed, in the semiconductor laser of the first embodiment. The Al composition ratio of AlGaInP layer 8 was set to 0.50. As AlGaInP layer 8 becomes thinner than 0.005 μm, the influence of the restart plane of crystal growth becomes apparent, which makes the carriers difficult to accumulate in saturable absorption region 7, so that the self-pulsation is less likely to occur.

(Second Embodiment)

Figure 5:
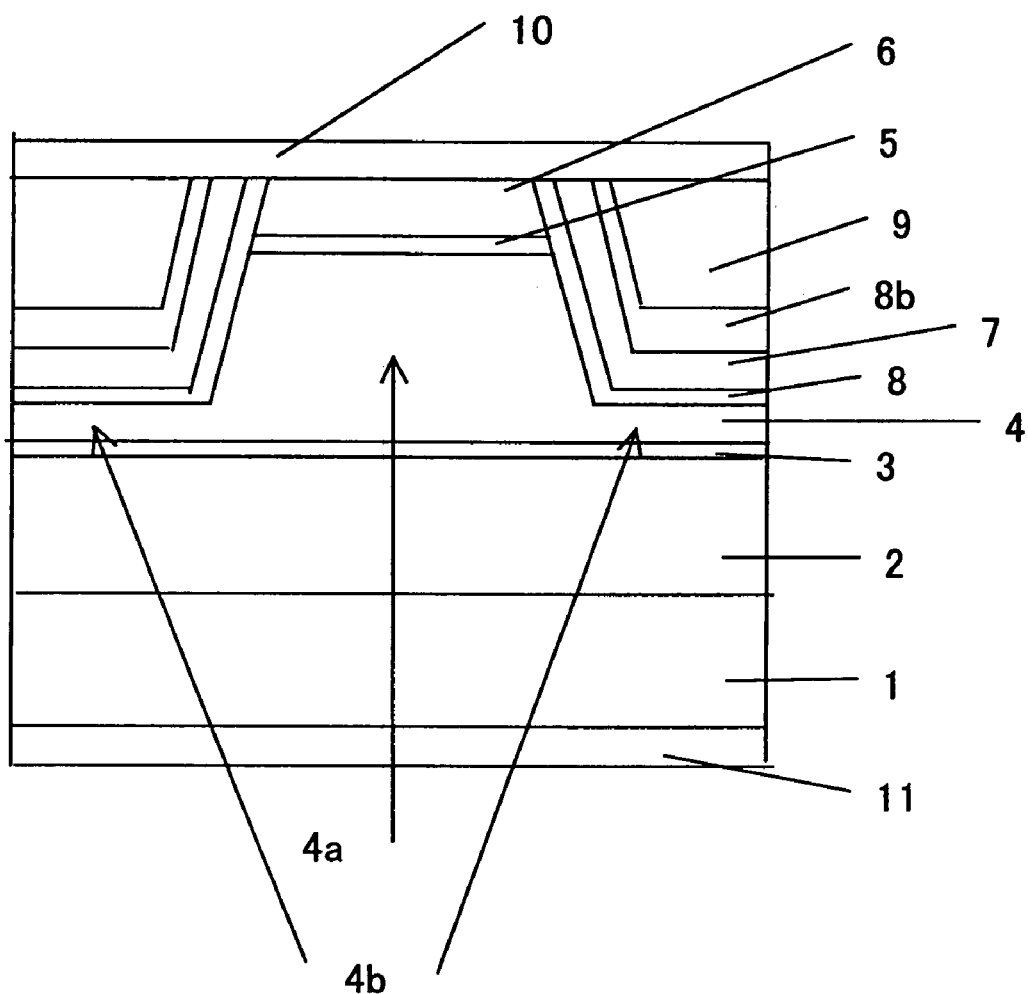
FIGS. 5–9 are schematic cross sectional views of self-pulsation type semiconductor lasers according to second through sixth embodiments, respectively, of the present invention.

An AlGaInP-based semiconductor laser according to the second embodiment of the present invention is shown in FIG. 5 in a schematic cross section. In this semiconductor laser, an n type $(Al_{0.65}Ga_{0.35})$ InP first clad layer 2, an SCH-MQW active layer 3 of undoped GaInP/AlGaInP, a p type $(Al_{0.65}Ga_{0.35})$ InP second clad layer 4, a p type GaInP intermediate layer 5, and a p type GaAs contact layer 6 are stacked successively on an n type GaAs substrate 1. SCH-MQW active layer 3 has a structure in which an MQW including GaInP quantum well layers (four layers, 5 nm thick each) and $(Al_{0.50}Ga_{0.50})$ InP barrier layers (three layers, 5 nm thick each) alternately stacked one on another is sandwiched between two $(Al0.50Ga_{0.50})$ InP guide layers (50 nm thick each).

Second clad layer 4 has a striped ridge portion 4a, and flat portions 4b on both sides of the ridge portion are thinner than the ridge portion. An embedding layer including a saturable absorption layer 7 is formed on either side surface of ridge portion 4a and on either flat portion 4b of p type clad layer 4.

Saturable absorption layer 7 is formed of undoped GaInP, which is sandwiched between an n type $(Al_{0.50}Ga_{0.50})$ InP layer 8 on its ridge side and an n type $(Al_{0.75}Ga_{0.25})$ InP layer 8b on the opposite side thereby forming a double-hetero structure. While n type $(Al_{0.50}Ga_{0.50})$ InP layer 8 has a refractive index greater than that of second clad layer 4, n type $(Al_{0.75}Ga_{0.25})$ InP layer 8b has a refractive index smaller than that of second clad layer 4. A current blocking layer 9 of an n type GaAs layer is formed on n type $(Al_{0.75}Ga_{0.25})$ InP layer 8b. Provided on the embedding layer and on the p type contact layer is a p-side electrode 10 of Au/Mo/AuZn. An n-side electrode 11 of Au/Mo/Ni/AuGe is provided on the backside of substrate 1.

The second embodiment differs from the first embodiment in that the double-hetero structure is achieved by providing semiconductor layer 8b having a bandgap greater than that of saturable absorption layer 7 on the opposite side of saturable absorption layer 7 as seen from the ridge portion. This can suppress diffusion of the carriers generated by light absorption in saturable absorption layer 7, so that the carriers can be accumulated efficiently in saturable absorption layer 7.

Since saturable absorption layer 7 itself is a region absorptive to laser light, it is preferable that the layer is formed as thin as possible. In the second embodiment, saturable absorption layer 7 can be made thin by making it efficiently accumulate the carriers, and then the threshold current can be lowered, as compared with in the case of the first embodiment.

Although saturable absorption layer 7 has a single-layer structure in the second embodiment, it may be formed with an MQW structure.

(Third Embodiment)

Figure 6:
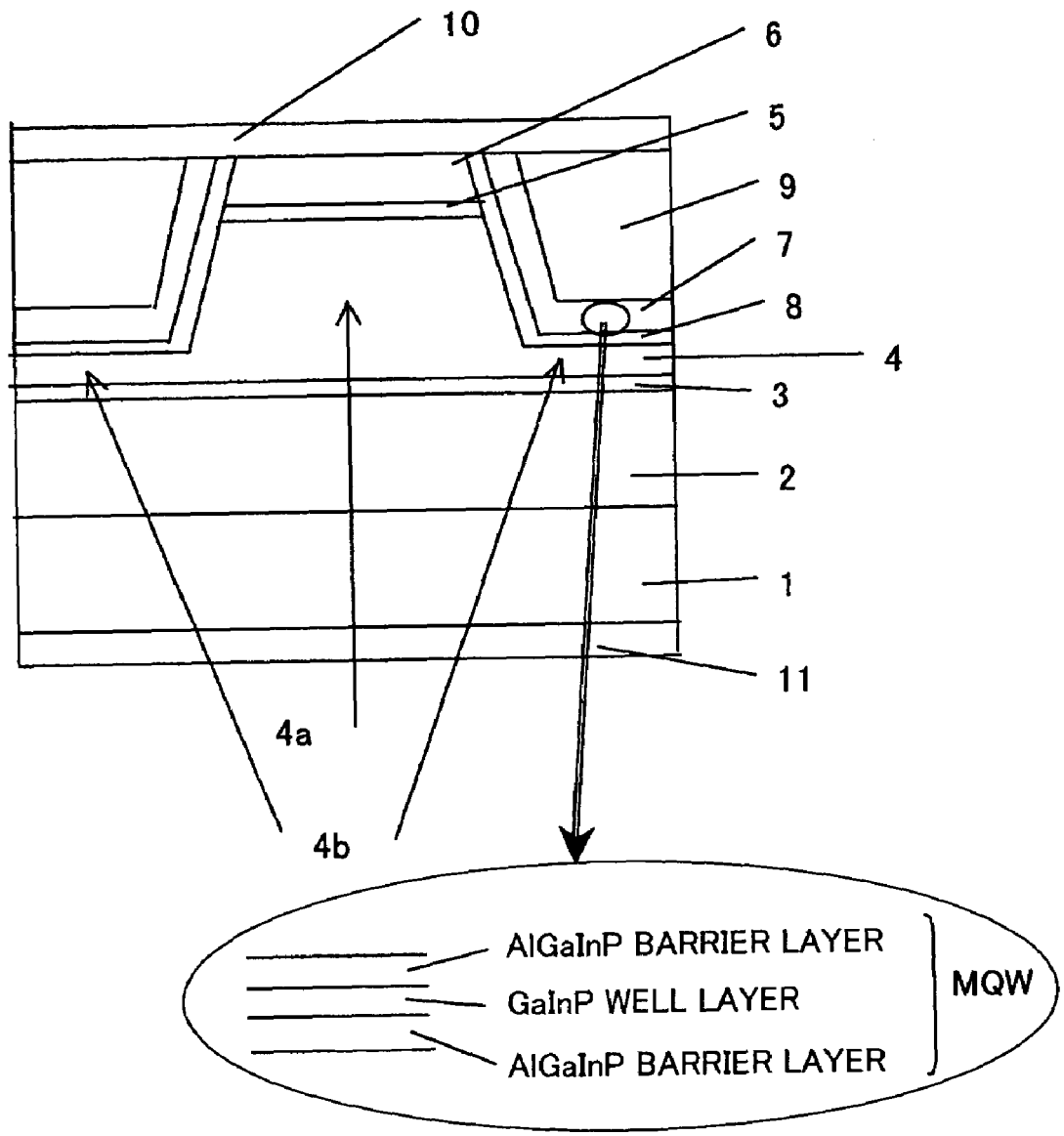

An AlGaInP-based semiconductor laser according to the third embodiment of the present invention is shown in FIG. 6 in a schematic cross section. In this semiconductor laser, an n type $(Al_{0.65}Ga_{0.35})$ InP first clad layer 2, an SCH-MQW active layer 3 of undoped GaInP/AlGaInP, a p type $(Al_{0.65}Ga_{0.35})$ InP second clad layer 4, a p type GaInP intermediate layer 5, and a p type GaAs contact layer 6 are stacked successively on an n type GaAs substrate 1. SCH-MQW active layer 3 has a structure in which an MQW including GaInP quantum well layers (four layers, 5 nm thick each) and $(Al_{0.50}Ga_{0.50})$ InP barrier layers (three layers, 5 nm thick each) alternately stacked one on another is sandwiched between two $(Al_{0.50}Ga_{0.50})$ InP guide layers (50 nm thick each).

Second clad layer 4 has a striped ridge portion 4a, and flat portions 4b on both sides of the ridge portion are thinner than the ridge portion. An embedding layer including a saturable absorption layer 7 is formed on either side surface of ridge portion 4a and on either flat portion 4b of p type clad layer 4.

Saturable absorption layer 7 is formed of an MQW structure of GaInP/$(Al_{0.65}Ga_{0.35})$ InP, on an n type $(Al_{0.65}Ga_{0.35})$ InP layer 8 having the same semiconductor composition as that of p type second clad layer 4. A current blocking layer 9 of an n type GaAs layer is formed on saturable absorption layer 7. Provided on the embedding layer and on the p type contact layer is a p-side electrode 10 of AuMo/AuZn. An n-side electrode 11 of Au/Mo/Ni/AuGe is provided on the backside of substrate 1.

In the case of the third embodiment, since p type clad layer 4 and n type AlGaInP layer 8 in the embedding layer have the same semiconductor composition, it is possible to share the setting of the semiconductor composition during crystal growth, enabling simpler growth of the layers.

(Fourth Embodiment)

Figure 7:
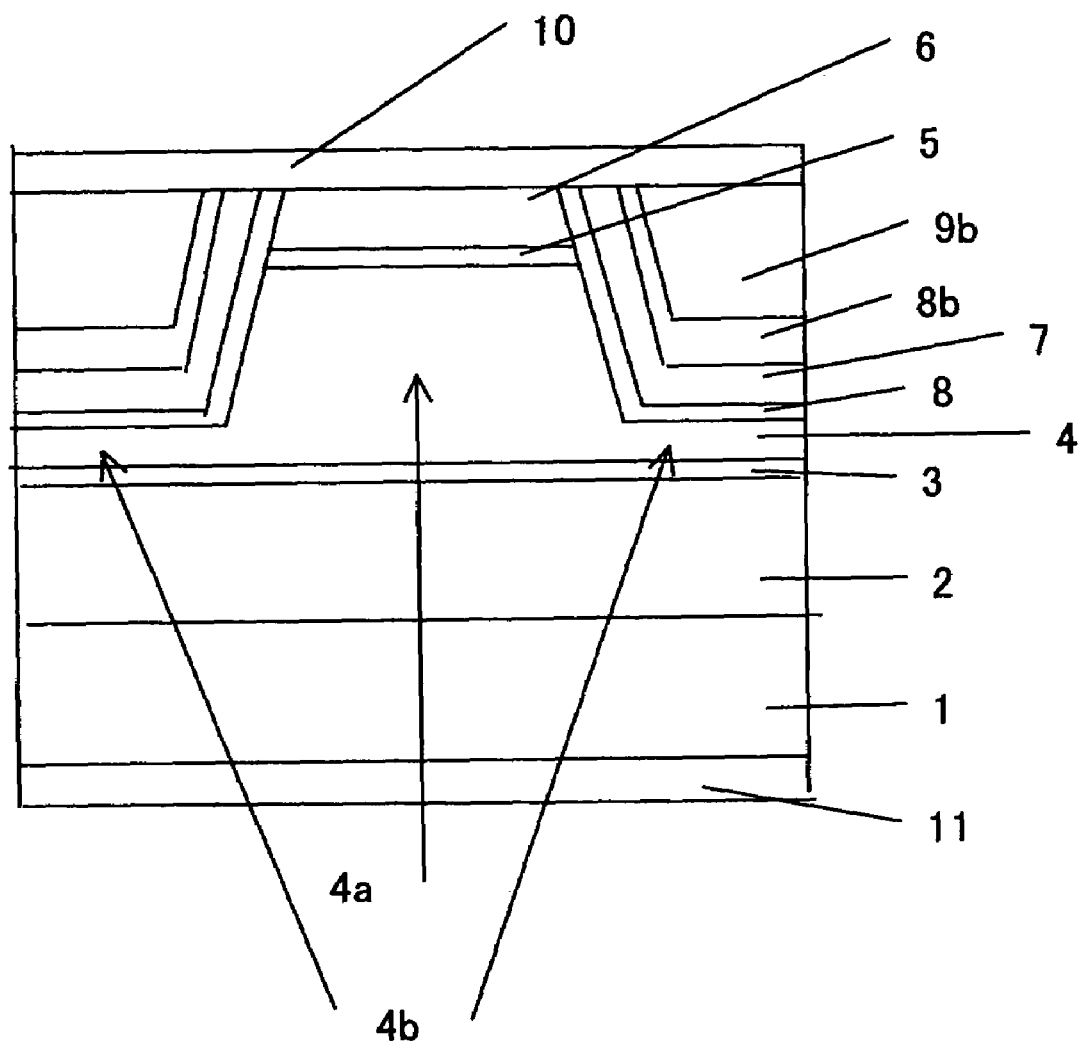

An AlGaInP-based semiconductor laser according to the fourth embodiment of the present invention is shown in FIG. 7 in a schematic cross section. In this semiconductor laser, an n type $(Al_{0.65}Ga_{0.35})$ InP first clad layer 2, an SCH-MQW active layer 3 of undoped GaInP/AlGaInP, a p type ($Al_{0.65}Ga_{0.35}$) InP second clad layer 4, a p type GaInP intermediate layer 5, and a p type GaAs contact layer 6 are stacked successively on an n type GaAs substrate 1. SCH-MQW active layer 3 has a structure in which an MQW including GaInP quantum well layers (four layers, 5 nm thick each) and ($Al_{0.50}Ga_{0.50}$) InP barrier layers (three layers, 5 nm thick each) alternately stacked one on another is sandwiched between two ($Al_{0.50}Ga_{0.50}$) InP guide layers (50 nm thick each).

Second clad layer 4 has a striped ridge portion 4a, and flat portions 4b on both sides of the ridge portion are thinner than the ridge portion. An embedding layer including a saturable absorption layer 7 is formed on either side surface of ridge portion 4a and on either flat portion 4b of p type clad layer 4.

Saturable absorption layer 7 is formed of undoped GaInP, which is sandwiched between an n type ($Al_{0.50}Ga_{0.50}$) InP layer 8 on its ridge side and an n type ($Al_{0.75}Ga_{0.25}$) InP layer 8b on the opposite side thereby forming a double-hetero structure. While n type ($Al_{0.50}Ga_{0.50}$) InP layer 8 has a refractive index greater than that of second clad layer 4, n type ($Al_{0.75}Ga_{0.25}$) InP layer 8b has a refractive index smaller than that of second clad layer 4. A current blocking layer 9b of an n type AlInP layer is formed on n type ($Al_{0.75}Ga_{0.25}$) InP layer 8b. Provided on the embedding layer and on the p type contact layer is a p-side electrode 10 formed of Au/Mo/AuZn. An n-side electrode 11 of Au/Mo/Ni/AuGe is provided on the backside of substrate 1.

The fourth embodiment differs from the first through third embodiments in that n type ($Al_{0.75}Ga_{0.25}$) InP layer 8b having a small refractive index and not absorbing laser light is used on the opposite side of saturable absorption layer 7 as seen from the ridge portion. In the first through third embodiments, GaAs layer 9 absorptive to laser light has been provided on saturable absorption layer 7, in which case the threshold current tends to become large due to the absorption loss and there is a possibility of degrading the luminous efficiency. In the fourth embodiment, on the other hand, a so-called effective refractive index guide structure suffering less absorption loss is obtained, so that it is possible to lower the threshold current and improve the luminous efficiency and reduce the operating current, as compared with the first through third embodiments.

(Fifth Embodiment)

Figure 8:
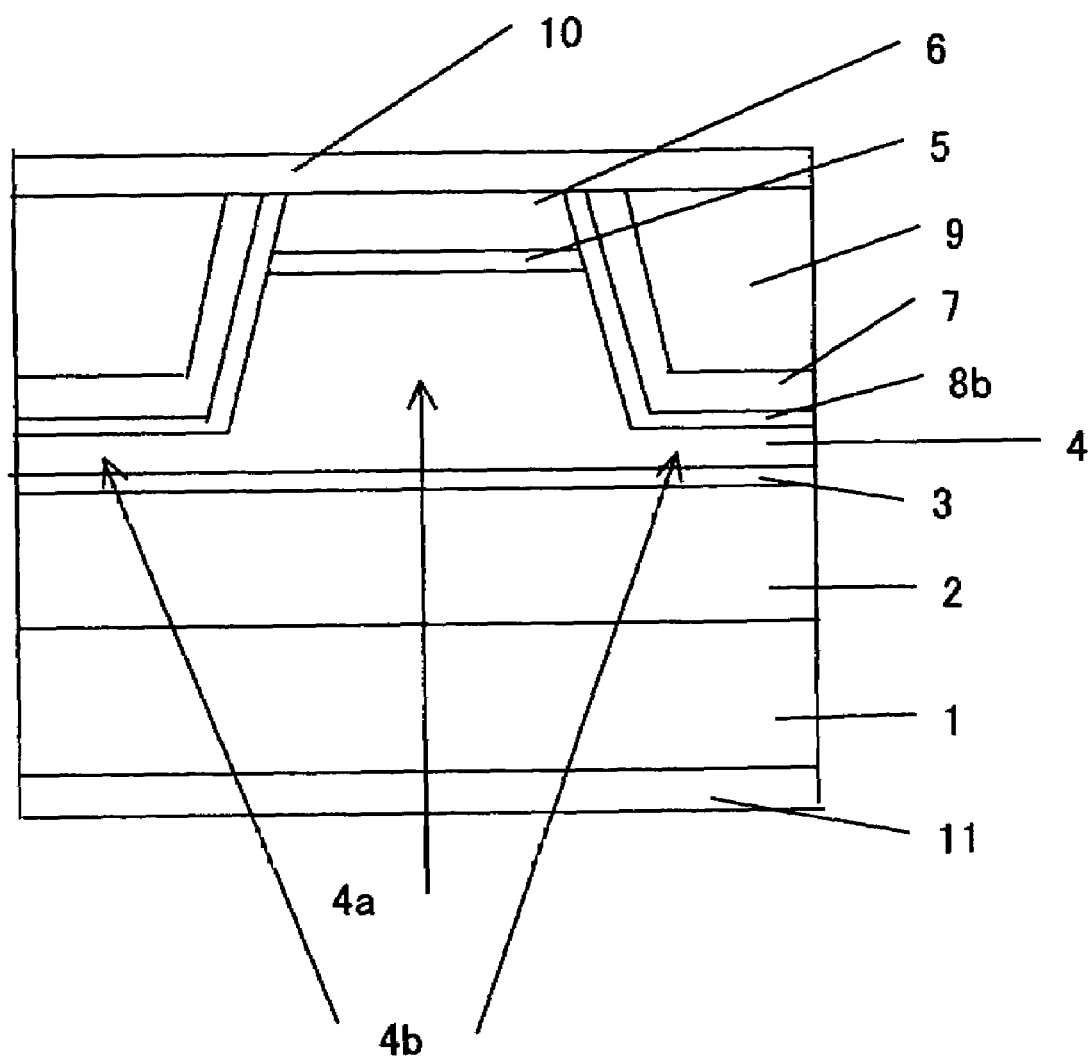

An AlGaInP-based semiconductor laser according to the fifth embodiment of the present invention is shown in FIG. 8 in a schematic cross section. In this semiconductor laser, an n type ($Al_{0.65}Ga_{0.35}$) InP first clad layer 2, an SCH-MQW active layer 3 of undoped GaInP/AlGaInP, a p type ($Al_{0.65}Ga_{0.35}$) InP second clad layer 4, a p type GaInP intermediate layer 5, and a p type GaAs contact layer 6 are stacked successively on an n type GaAs substrate 1. SCH-MQW active layer 3 has a structure in which an MQW including of GaInP quantum well layers (four layers, 5 nm thick each) and ($Al_{0.50}Ga_{0.50}$) InP barrier layers (three layers, 5 nm thick each) alternately stacked one on another is sandwiched between two ($Al_{0.50}Ga_{0.50}$) InP guide layers (50 nm thick each).

Second clad layer 4 has a striped ridge portion 4a, and flat portions 4b on both sides of the ridge portion are thinner than the ridge portion. An embedding layer including a saturable absorption layer 7 is formed on either side surface of ridge portion 4a and on either flat portion 4b of p type clad layer 4.

Saturable absorption layer 7 is formed of n type GaAs, on an n type $Al_{0.4}Ga_{0.6}As$ layer 8b having a refractive index greater than that of second clad layer 4. A current blocking layer 9 of an n type GaAs layer is formed on saturable absorption layer 7. Provided on the embedding layer and on the p type contact layer is a p-side electrode 10 formed of Au/Mo/AuZn. An n-side electrode 11 of Au/Mo/Ni/AuGe is provided on the backside of substrate 1.

The AlGaInP-based semiconductor laser of the fifth embodiment differs from those of the first through fourth embodiments in that saturable absorption layer 7 is formed of GaAs. When GaAs used for saturable absorption layer 7 in the fifth embodiment is compared with GaInP used for saturable absorption layer 7 in the first through fourth embodiments, GaAs exhibits a greater change in absorption coefficient depending on the amount of carriers generated by photo excitation, and it can cause saturable absorption more efficiently. As a result, the use of GaAs for saturable absorption layer 7 enables the self-pulsation operation at a higher temperature or with a higher output as compared with in the case of using GaInP.

(Sixth Embodiment)

Figure 9:
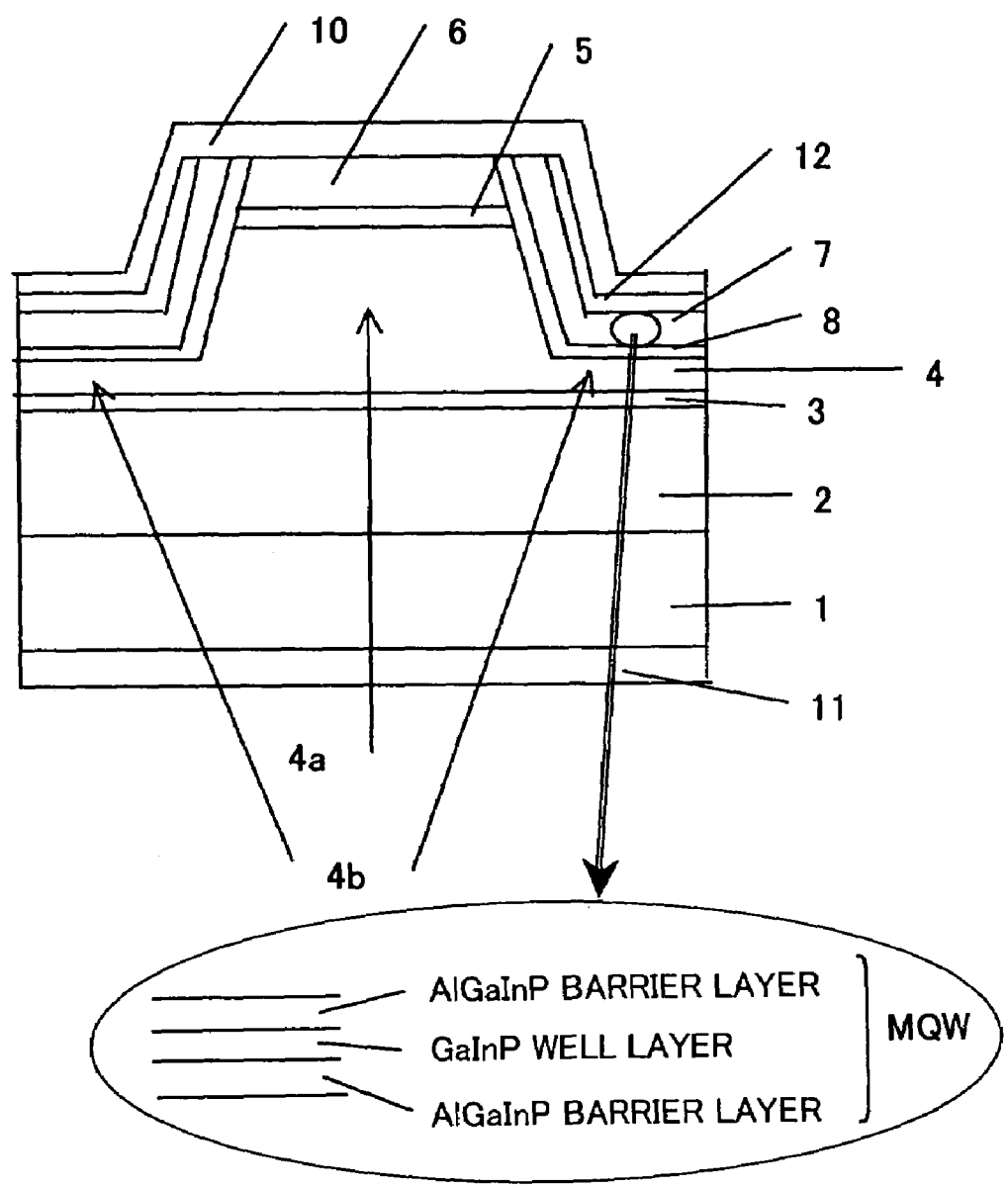

An AlGaInP-based semiconductor laser according to the sixth embodiment of the present invention is shown in FIG. 9 in a schematic cross section. In this semiconductor laser, an n type ($Al_{0.65}Ga_{0.35}$) InP first clad layer 2, an SCH-MQW active layer 3 of undoped GaInP/AlGaInP, a p type ($Al_{0.65}Ga_{0.35}$) InP second clad layer 4, a p type GaInP intermediate layer 5, and a p type GaAs contact layer 6 are stacked successively on an n type GaAs substrate 1. SCH-MQW active layer 3 has a structure in which an MQW including GaInP quantum well layers (four layers, 5 nm thick each) and ($Al_{0.50}Ga_{0.50}$) InP barrier layers (three layers, 5 nm thick each) alternately stacked one on another is sandwiched between two ($Al_{0.50}Ga_{0.50}$) InP guide layers (50 nm thick each).

Second clad layer 4 has a striped ridge portion 4a, and flat portions 4b on both sides of the ridge portion are thinner than the ridge portion. An embedding layer including a saturable absorption layer 7 is formed on either side surface of ridge portion 4a and on either flat portion 4b of p type clad layer 4.

Saturable absorption layer 7 is formed of an MQW structure of n type GaAs/$Al_{0.4}Ga_{0.6}As$, on an n type $Al_{0.4}Ga_{0.6}As$ layer 8 having a refractive index greater than that of second clad layer 4. The embedding layer is also formed in the ridge stripe shape, on which an insulating film 12 of $SiO_2$ is formed. A p-side electrode 10 of Au/Mo/AuZn is provided on p type contact layer 6 and on $SiO_2$ insulating film 12. An n-side electrode 11 of Au/Mo/Ni/AuGe is provided on the backside of substrate 1.

The semiconductor laser of the sixth embodiment has a so-called air ridge structure wherein the embedding layer including saturable absorption layer 7 has the ridge shape, which causes an effective refractive index guide. Thus, it is possible to further lower the threshold current and improve the luminous efficiency and reduce the operating current, as compared to the fifth embodiment.

(Seventh Embodiment)

An AlGaInP-based semiconductor laser according to the seventh embodiment of the present invention is similar to the semiconductor laser shown in FIG. 9, except that the guide layers sandwiching the MQW light-emitting layer are different in thickness from each other. Specifically, an n type ($Al_{0.65}Ga_{0.35}$) InP first clad layer 2, an SCH-MQW active layer 3 of undoped GaInP/AlGaInP, a p type ($Al_{0.65}Ga_{0.35}$) InP second clad layer 4, a p type GaInP intermediate layer 5, and a p type GaAs contact layer 6 are stacked successively on an n type GaAs substrate 1. SCH-MQW active layer 3 has a structure in which an MQW structure including GaInP quantum well layers (four layers, 5 nm thick each) and ($Al_{0.50}Ga_{0.50}$) InP barrier layers (three layers, 5 nm thick each) alternately stacked one on another is sandwiched between a p-side ($Al_{0.50}Ga_{0.50}$) InP guide layer (of a thickness of 100 nm) and an n-side ($Al_{0.50}Ga_{0.50}$) InP guide layer (of a thickness of 20 nm).

Second clad layer 4 has a striped ridge portion 4a, and flat portions 4b on both sides of the ridge portion are thinner than the ridge portion. An embedding layer including a saturable absorption layer 7 is formed on either side surface of ridge portion 4a and on either flat portion 4b of p type clad layer 4.

Saturable absorption layer 7 is formed of an MQW structure of n type GaAs/$Al_{0.4}Ga_{0.6}$As, on an n type $Al_{0.4}Ga_{0.6}$As layer 8 having a refractive index greater than that of second clad layer 4. The embedding layer is also formed in the ridge stripe shape, and a $SiO_2$ insulating film 12 is formed thereon. Provided on p type contact layer 6 and $SiO_2$ insulating film 12 is a p-side electrode 10 formed of Au/Mo/AuZn. An n-side electrode 11 of Au/Mo/Ni/AuGe is provided on the backside of substrate 1.

In the seventh embodiment, the guide layers sandwiching the MQW light-emitting layer are made asymmetrical in thickness with respect to each other, to spread light toward the p side where saturable absorption layer 7 exists. As a result, the light intensity in saturable absorption layer 7 increases in the seventh embodiment, and thus it is possible to cause self-pulsation more effectively than in the sixth embodiment.

(Eighth Embodiment)

An AlGaInP-based semiconductor laser according to the eighth embodiment of the present invention is similar to the semiconductor laser shown in FIG. 9, except that the clad layers sandwiching the MQW active layer have composition ratios different from each other. Specifically, an n type ($Al_{0.70}Ga_{0.30}$) InP first clad layer 2, an SCH-MQW active layer 3 of undoped GaInP/AlGaInP, a p type ($Al_{0.60}Ga_{0.40}$) InP second clad layer 4, a p type GaInP intermediate layer 5, and a p type GaAs contact layer 6 are stacked successively on an n type GaAs substrate 1. SCH-MQW active layer 3 has a structure in which an MQW structure including GaInP quantum well layers (four layers, 5 nm thick each) and ($Al_{0.50}Ga_{0.50}$) InP barrier layers (three layers, 5 nm thick each) alternately stacked one on another is sandwiched between two ($Al_{0.50}Ga_{0.50}$) InP guide layers (50 nm thick each).

Second clad layer 4 has a striped ridge portion 4a, and flat portions 4b on both sides of the ridge portion are thinner than the ridge portion. An embedding layer including a saturable absorption layer 7 is formed on either side surface of ridge portion 4a and on either flat portion 4b of p type clad layer 4.

Saturable absorption layer 7 is formed of an MQW structure of n type GaAs/$Al_{0.4}Ga_{0.6}$As, on an n type $Al_{0.4}Ga_{0.6}$As layer 8 having a refractive index greater than that of second clad layer 4. The embedding layer is also formed in the ridge stripe shape, and a $SiO_2$ insulating film 12 is formed thereon. Provided on p type contact layer 6 and $SiO_2$ insulating film 12 is a p-side electrode 10 formed of Au/Mo/AuZn. An n-side electrode 11 of Au/Mo/Ni/AuGe is provided on the backside of substrate 1.

In the eighth embodiment, two clad layers 2 and 4 sandwiching MQW active layer 3 are made asymmetrical in semiconductor composition ratio with respect to each other. That is, the refractive index of second clad layer 4 is made greater than that of first clad layer 2, to spread light toward the p side where saturable absorption layer 7 exists. As a result, the light intensity in saturable absorption layer 7 increases in the eighth embodiment, and thus it is possible to cause self-pulsation more effectively than in the sixth embodiment.

(Ninth Embodiment)

Figure 10:
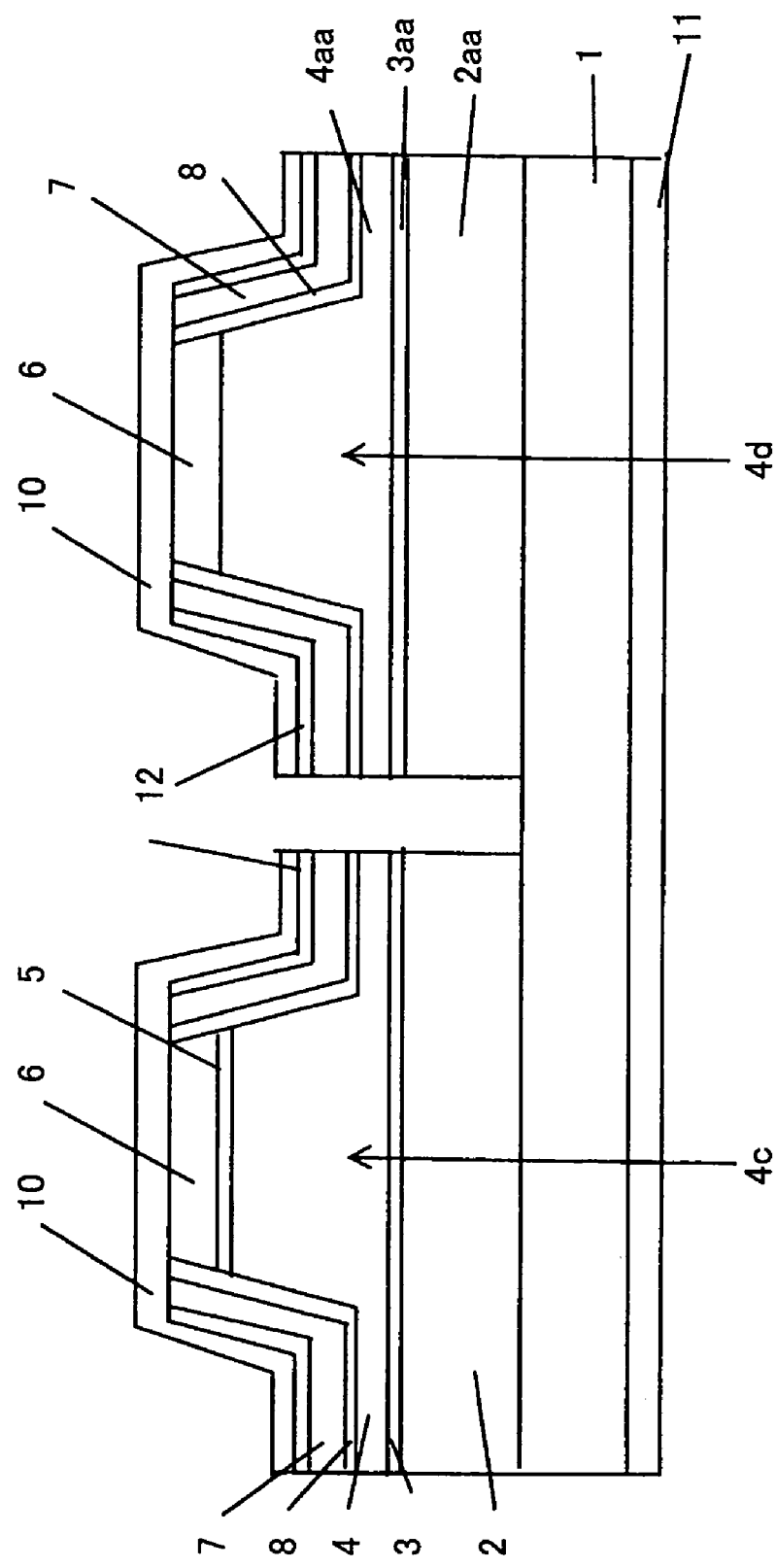
FIG. 10 is a schematic cross sectional view of a self-pulsation type semiconductor laser according to a ninth embodiment of the present invention.
Figure 11:
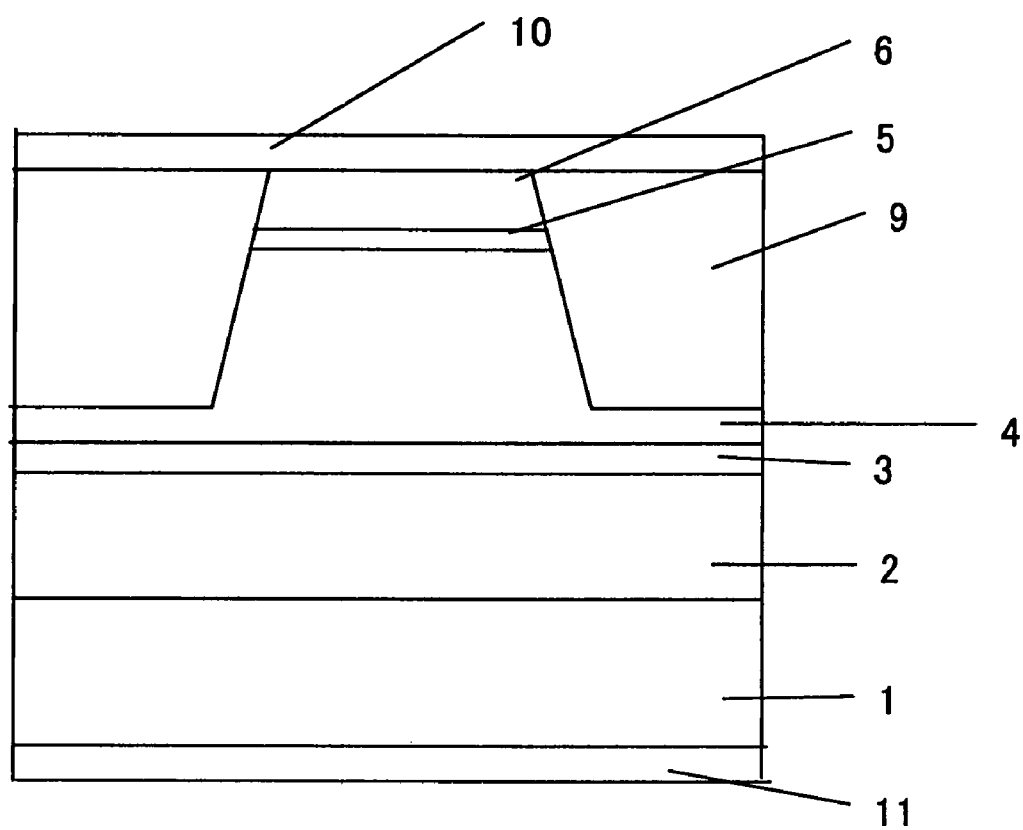
FIGS. 11 and 12 are schematic cross sectional views of self-pulsation type semiconductor lasers according to first and second conventional examples, respectively.
Figure 12:
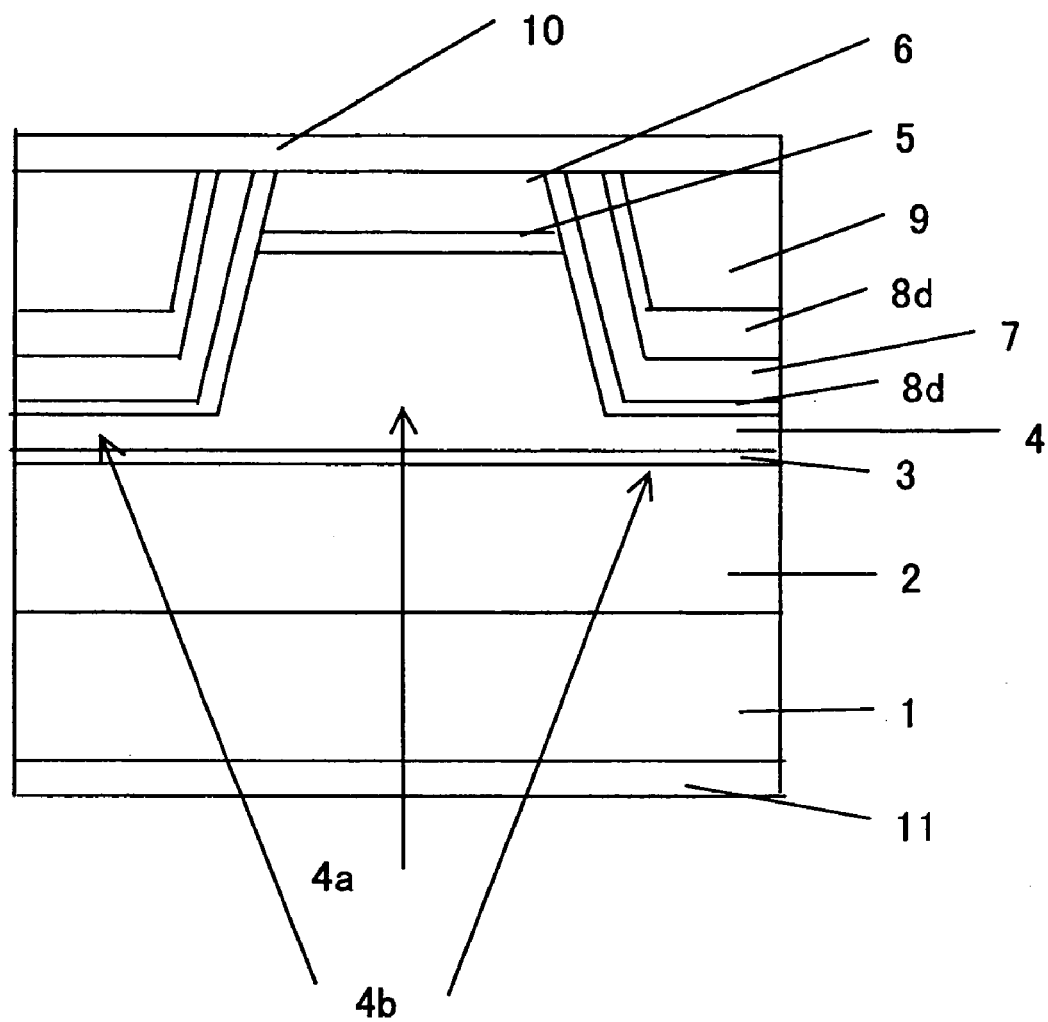

An AlGaInP/AlGaAs-based two-wavelength semiconductor laser according to the ninth embodiment of the present invention is shown in FIG. 10 in a schematic cross section. This semiconductor laser includes a first ridge portion 4c where an n type ($Al_{0.65}Ga_{0.35}$) InP first clad layer 2, an SCH-MQW active layer 3 of undoped GaInP/AlGaInP, a p type ($Al_{0.65}Ga_{0.35}$) InP second clad layer 4, a p type GaInP intermediate layer 5, and a p type GaAs contact layer 6 are stacked successively on an n type GaAs substrate 1. SCH-MQW active layer 3 has a structure in which an MQW structure including GaInP quantum well layers (four layers, 5 nm thick each) and ($Al_{0.50}Ga_{0.50}$) InP barrier layers (three layers, 5 nm thick each) alternately stacked one on another is sandwiched between two ($Al_{0.50}Ga_{0.50}$) InP guide layers (50 nm thick each).

The semiconductor laser further includes a second ridge portion 4d where an n type $Al_{0.45}Ga_{0.55}$As first clad layer 2aa, an SCH-MQW active layer 3aa of undoped GaAs/AlGaAs, a p type ($Al_{0.65}Ga_{0.35}$) InP second clad layer 4aa, and a p type GaAs contact layer 6 are stacked successively on the same n type GaAs substrate 1. SCH-MQW active layer 3aa has a structure in which an MQW including GaAs quantum well layers (four layers, 5 nm thick each) and $Al_{0.45}Ga_{0.55}$As barrier layers (three layers, 5 nm thick each) alternately stacked one on another is sandwiched between two $Al_{0.15}Ga_{0.85}$As guide layers (50 nm thick each).

Two ridge portions 4c and 4d are processed into ridge stripe shapes after formation of a common embedding layer including a saturable absorption layer 7. An insulating film 12 of $SiO_2$ is formed on the common embedding layer. A p-side electrode 10 of Au/Mo/AuZn is provided on p type contact layer 6 and $SiO_2$ insulating film 12. An n-side electrode 11 of Au/Mo/Ni/AuGe is formed on the backside of substrate 1. Saturable absorption layer 7 is formed of an MQW structure of n type GaAs/$Al_{0.4}Ga_{0.6}$As, on an n type $Al_{0.4}Ga_{0.6}$As layer 8 having a refractive index greater than that of the second clad layer.

In the semiconductor laser of the ninth embodiment, red laser light of a wavelength band of about 650 nm can be emitted from active layer 3 beneath ridge portion 4c, and infrared laser light of a wavelength band of about 780 nm can be emitted from active layer 3aa beneath ridge portion 4d. The self-pulsation operations are achieved in the both ridge portions by the function of saturable absorption layer 7 common to ridge portions 4c and 4d.

As described above, according to the present invention, it is possible to provide a low-noise, self-pulsation type semiconductor laser capable of operating stably at a high temperature, in which the light intensity in the saturable absorption layer formed in the embedding layer can be increased, and the ellipticity of the beam cross section can be small preventing increase of the vertical radiation angle.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A self-pulsation type semiconductor laser comprising a first clad layer of a first conductivity type, an active layer, and a second clad layer of a second conductivity type having a striped ridge portion, successively stacked on a semiconductor substrate of the first conductivity type,
wherein a saturable absorption layer of a semiconductor is epitaxially grown on a semiconductor layer having a refractive index equal to or greater than that of said second clad layer and not absorbing laser light, within an embedding layer formed on either side surface of said ridge portion and on either flat portion other than said ridge portion in said second clad layer and wherein said active layer includes an SCH structure having a light emitting layer sandwiched between two light guide layers, and has an asymmetrical structure in a stacking direction of the layers so that light can spread toward the ridge.

2. The self-pulsation type semiconductor laser according to claim 1, wherein said saturable absorption layer includes a quantum well structure.

3. The self-pulsation type semiconductor laser according to claim 1, wherein said saturable absorption layer is sandwiched between two semiconductor layers having their respective bandgaps greater than a bandgap of the saturable absorption layer.

4. The self-pulsation type semiconductor laser according to claim 3, wherein one of the two semiconductor layers sandwiching said saturable absorption layer, located farther from the ridge portion, has a refractive index smaller than that of said second clad layer.

5. The self-pulsation type semiconductor laser according to claim 1, wherein at least one of upper and lower sides of said saturable absorption layer is covered with a semiconductor layer having the same composition as that of said second clad layer.

6. The self-pulsation type semiconductor laser according to claim 1, wherein a current blocking layer of a material absorptive to the laser light is formed on an opposite side of said saturable absorption layer as seen from said second clad layer.

7. The self-pulsation type semiconductor laser according to claim 1, wherein a current blocking layer of a material having a refractive index smaller than that of said second clad layer and not absorbing the laser light is formed on an opposite side of said saturable absorption layer as seen from said second clad layer.

8. The self-pulsation type semiconductor laser according to claim 1, wherein said light guide layer on the second clad layer side is greater in thickness than said light guide layer on the first clad layer side.

9. The self-pulsation type semiconductor laser according to claim 1, wherein said second clad layer has a refractive index greater than that of said first clad layer.

10. The self-pulsation type semiconductor laser according to claim 1, wherein said self-pulsation type semiconductor laser is an AlGaInP-based laser, said substrate is of GaAs, and said saturable absorption layer is formed of an AlGaAs-based semiconductor.

11. The self-pulsation type semiconductor laser according to claim 10, wherein an AlGaAs layer having a refractive index greater than that of said second clad layer is formed on the under surface of said saturable absorption layer, the AlGaAs layer having an Al composition ratio set in a range of 0.4–0.6, and a GaAs layer is formed on the upper surface of said saturable absorption layer.

12. The self-pulsation type semiconductor laser according to claim 10, wherein an AlGaAs layer having a refractive index greater than that of said second clad layer is formed on the under surface of said saturable absorption layer, the AlGaAs layer having an Al composition ratio set in a range of 0.4–0.6, and an AlGaAs layer having an Al composition ratio set to exceed 0.6 is formed on the upper surface of said saturable absorption layer.

13. The self-pulsation type semiconductor laser according to claim 1, wherein said embedding layer is formed in a striped ridge shape.

14. The self-pulsation type semiconductor laser according to claim 13, wherein an insulating film is formed on said ridge-shaped embedding layer.

15. The self-pulsation type semiconductor laser according to claim 14, wherein in an AlGaInP-based self-pulsation type semiconductor laser formed on a GaAs substrate, an AlGaAs layer having a refractive index greater than that of said second clad layer is formed on the upper surface of said saturable absorption layer within said embedding layer, the AlGaAs layer having an Al composition ratio set in a range of 0.4–0.6 and being formed in a ridge shape, and said insulating film is formed on the AlGaAs layer.

16. The self-pulsation type semiconductor laser according to claim 1, wherein a plurality of semiconductor lasing parts having different lasing wavelengths are formed monolithically, and said plurality of semiconductor lasing parts each have said embedding layer including said saturable absorption layer formed of a same semiconductor material.

17. The self-pulsation type semiconductor laser according to claim 16, wherein an AlGaAs-based semiconductor lasing part and an AlGaInP-based semiconductor lasing part are formed monolithically into a two-wavelength semiconductor laser, and said saturable absorption layer is formed of an AlGaAs-based semiconductor.

* * * * *